US011385118B2

(12) United States Patent
Frye et al.

(10) Patent No.: US 11,385,118 B2
(45) Date of Patent: Jul. 12, 2022

(54) PRESSURE SENSOR WITH EXTERNAL VERTICAL ELECTRICAL INTERCONNECTION SYSTEM

(71) Applicant: Vitesco Technologies USA, LLC., Auburn Hills, MI (US)

(72) Inventors: Jeffrey J. Frye, Deer Park, IL (US); Joe Pin Wang, Deer Park, IL (US); David W. Ivaska, Deer Park, IL (US); Richard E. Cronin, Deer Park, IL (US); Erich Mattmann, Schwalbach (DE); Frank Langner, Schwalbach (DE)

(73) Assignee: Vitesco Technologies USA, LLC, Auburn Hills, MI (US)

(*) Notice: Subject to any disclaimer, the term of this patent is extended or adjusted under 35 U.S.C. 154(b) by 326 days.

(21) Appl. No.: 16/663,851

(22) Filed: Oct. 25, 2019

(65) Prior Publication Data

US 2020/0182728 A1 Jun. 11, 2020

Related U.S. Application Data

(60) Provisional application No. 62/776,612, filed on Dec. 7, 2018.

(51) Int. Cl.
*G01L 19/14* (2006.01)
*H05K 5/06* (2006.01)
(Continued)

(52) U.S. Cl.
CPC .............. *G01L 19/142* (2013.01); *B23K 1/19* (2013.01); *G01L 9/0044* (2013.01);
(Continued)

(58) Field of Classification Search
None
See application file for complete search history.

(56) References Cited

U.S. PATENT DOCUMENTS 5,407,501 A 4/1995 Koen et al.
8,171,800 B1* 5/2012 Chiou .................. G01L 13/026
73/736
(Continued)

FOREIGN PATENT DOCUMENTS

CN 103229033 A 7/2013
CN 204177507 U 2/2015
(Continued)

OTHER PUBLICATIONS

Chinese Office Action dated Apr. 29, 2021 for corresponding Chinese Patent Application No. 201911241840.6.

*Primary Examiner* — Peter J Macchiarolo
*Assistant Examiner* — Jermaine L Jenkins (57) ABSTRACT

A pressure sensor assembly, which includes a support substrate, circuitry mounted to the support substrate, at least one conductor mounted to the support substrate and in electrical communication with the circuitry, and at least one vertically conductive path connected to and in electrical communication with the at least one conductor. The pressure sensor assembly also includes a diaphragm, at least one sealing glass section connected to the diaphragm and the support substrate, and at least one lateral conductive feed-through mounted to the diaphragm. At least one conductive joint is connected to the vertically conductive path and the lateral conductive feed-through, and the conductive joint provides electrical communication between the vertically conductive path and the lateral conductive feed-through.

18 Claims, 7 Drawing Sheets

(51) Int. Cl.
  *G01L 19/00* (2006.01)
  *G01L 9/00* (2006.01)
  *B23K 1/19* (2006.01)

(52) U.S. Cl.
  CPC ........ *G01L 19/0061* (2013.01); *G01L 19/147* (2013.01); *H05K 5/068* (2013.01)

(56) References Cited

U.S. PATENT DOCUMENTS

| | | |
|---|---|---|
| 8,815,625 B2 | 8/2014 | Monichino |
| 9,541,461 B2 | 1/2017 | Cogliati et al. |
| 9,759,620 B2 | 9/2017 | Monichino |
| 9,846,095 B2 * | 12/2017 | Chiou .................. G01L 9/0055 |
| 11,053,115 B2 * | 7/2021 | Ghidoni ................ G01J 1/429 |
| 2018/0301246 A1 | 10/2018 | Ito et al. |

FOREIGN PATENT DOCUMENTS

| | | | | |
|---|---|---|---|---|
| CN | 105209877 A | | 12/2015 | |
| CN | 108700482 A | * | 10/2018 | ............... G01L 9/06 |
| CN | 108725341 A | | 11/2018 | |
| CN | 111094923 A | | 5/2020 | |
| DE | 102009047509 A1 | | 6/2011 | |
| JP | 3208512 B2 | | 9/2001 | |

\* cited by examiner

PRESSURE SENSOR WITH EXTERNAL VERTICAL ELECTRICAL INTERCONNECTION SYSTEM

CROSS-REFERENCE TO RELATED APPLICATIONS

This application claims the benefit of provisional application 62/776,612, filed Dec. 7, 2018. The disclosure of the above application is incorporated herein by reference.

FIELD OF THE INVENTION

The invention relates generally to a pressure sensor assembly which has at least one conductive joint for providing electrical communication between a lateral conductive feed-through mounted to a diaphragm and a vertically conductive path, which is part of a support substrate, to create a conductive connection between a sensing bridge and a signal conditioning circuit.

BACKGROUND OF THE INVENTION

Pressure sensor elements based on thick-film ceramic technology are typically constructed by attaching two ceramic substrates, a diaphragm, and a support, with low temperature thick-film insulating sealing glass. The sealing glass is patterned to leave a sealed center opening for diaphragm flexing. In this opening, the sensing bridge is formed on the inside surface of the diaphragm.

Sensor packaging typically requires an electrical interface between the sensor element and the signal conditioning circuit to be on the top outside surface of the support. This requires a vertical conductive connection between the top of the support and the top surface of the diaphragm in order to connect the sensing bridge to the signal conditioning circuit (ASIC).

However, most pressure sensor elements require use of the internal area of the support to connect the sensing bridge to the signal conditioning circuit, which requires additional steps during fabrication, and increases cost.

Accordingly, there exists a need for a vertical conductive connection between the sensing bridge and the signal conditioning circuit which does not require use of the internal area of the support.

SUMMARY OF THE INVENTION

In one embodiment, the present invention is a pressure sensor assembly which includes a support substrate with top side contacts of a signal conditioning circuit connected to a conductive coating of side castellations on a sidewall of the support substrate, creating a conductive path from the top to the bottom of the support substrate.

The present invention also includes a diaphragm substrate (or second substrate) that is dimensionally wider than the support substrate in areas of the side castellations, and includes corresponding top side terminations of lateral feed throughs connected to sensing bridge circuit. The diaphragm substrate is attached to support substrate by insulating attachment material (sealing glass) of thickness <100 um.

Conductive joining material bridges across the gap created by thickness of the attachment material to form a conductive connection between bottom end of the side castellations on the support substrate and the lateral feed-through terminations on the diaphragm (second substrate). Together, these components of the ceramic thick-film assembly, accomplish a conductive connection between sensing bridge and signal conditioning circuit In one embodiment, the present invention is a pressure sensor assembly, which includes a support substrate, circuitry mounted to the support substrate, at least one conductor mounted to the support substrate and in electrical communication with the circuitry, and at least one vertically conductive path connected to and in electrical communication with the conductor. The pressure sensor assembly also includes a diaphragm substrate, at least one sealing glass section connected to the diaphragm substrate and the support substrate, and at least one lateral conductive feed-through mounted to the diaphragm. At least one conductive joint is connected to the vertically conductive path and the lateral conductive feed-through, and the conductive joint provides electrical communication between the vertically conductive path and the lateral conductive feed-through.

In one embodiment, the vertically conductive path includes at least one side castellation integrally formed as part of the support substrate, and at least one section of conductive material deposited on the side castellation. The section of conductive material is in electrical communication with the at least one conductor, and the section of conductive material is connected to and in electrical communication with the at least one conductive joint.

In an embodiment, the side castellation integrally formed as part of a side surface of the support substrate.

In another embodiment, the vertically conductive path is an extension of the conductor. In an embodiment, the extension portion is located on a side surface of the support substrate.

In yet another embodiment, the vertically conductive path is at least one chamfer integrally formed as part of the substrate used in combination with an extension of the at least one conductor. The conductive joint is located such that the conductive joint is in contact with the chamfer, and the provides electrical communication between the extension and the lateral conductive feed-through.

In an embodiment, the width and depth of the support substrate is equal to the width and depth of the diaphragm substrate.

In an embodiment, the at least one conductive joint further comprising at least one of a solder material or an ECA material.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

An embodiment of a pressure sensor assembly according to the present invention is shown in FIGS. 1-5, generally at 10. The assembly 10 is an absolute pressure sensor, and includes circuitry, which in this embodiment, is a signal conditioning Application Specific Integrated Circuit (ASIC) 12 mounted to a support substrate 14. However, it is within the scope of the invention that in other embodiments, there may be a printed circuit board (PCB) mounted to the support substrate 14, and the circuitry is mounted to the PCB. Referring again to FIGS. 1-5, connected to and in electrical communication with the ASIC 12 is a plurality of conductors 16, which are mounted to the top surface 14a of the support substrate 14. Formed as part of the support substrate 14 is a plurality of side castellations 18. In this embodiment each of the side castellations 18 is a semi-circular cut-out portion formed as part of one of the side surfaces 14b of the support substrate 14, but it is within the scope of the invention that other shapes may be used. Each of the side castellations 18 is lined with a section of conductive material, shown at 40, and various sections of conductive material 40 are connected to and in electrical communication with a corresponding one of the conductors 16. Each of the side castellations 18 in combination with the sections of conductive material 40 form a first embodiment of a plurality of vertical conductive paths.

In one embodiment, each section of conductive material 40 is a sintered conductive material, such as silver, but it is within the scope of the invention that other types of materials may be used, such as, but not limited to, a sintered thick-film paste, or a metallized material.

The assembly 10 also includes a diaphragm substrate 20 and mounted to the diaphragm substrate 20 is a sensing bridge, shown generally at 22. Also mounted to the diaphragm substrate 20 is a plurality of lateral conductive feed-throughs 24. In the embodiment shown, there are several lateral conductive feed-throughs 24, but it is within the scope of the invention that more or less lateral conductive feed-throughs 24 may be used, to correspond to the number of vertical conductive paths. There is also a sealing glass section 26, which is used to connect the diaphragm substrate 20 to the support substrate 14.

After the support substrate 14 is connected to the diaphragm substrate 20, the sections of conductive material 40 are placed in electrical communication with the lateral conductive feed-throughs 24. This is achieved by the use of a plurality of conductive joints 28, where each conductive joint 28 is connected to a corresponding section of conductive material 40 and a corresponding pad 44 of each of the lateral conductive feed throughs 24. In one embodiment, the conductive joints 28 are made from a solder material, but it is within the scope of the invention that the conductive joints 28 may be made from other conductive joining materials as well, such as, but not limited to, an Electrically Conductive Adhesive (ECA).

The addition of the conductive joints 28 allows for electrical communication between the ASIC 12 and the sensing bridge 22. More specifically, the ASIC 12 and the sensing bridge 22 are electrically connected through the conductors 16, the sections of conductive material 40, the conductive joints 28, and the lateral conductive feed-throughs 24. Information regarding pressure readings from the sensing bridge 22 is able to be transferred to the ASIC 12.

Figure 6A:
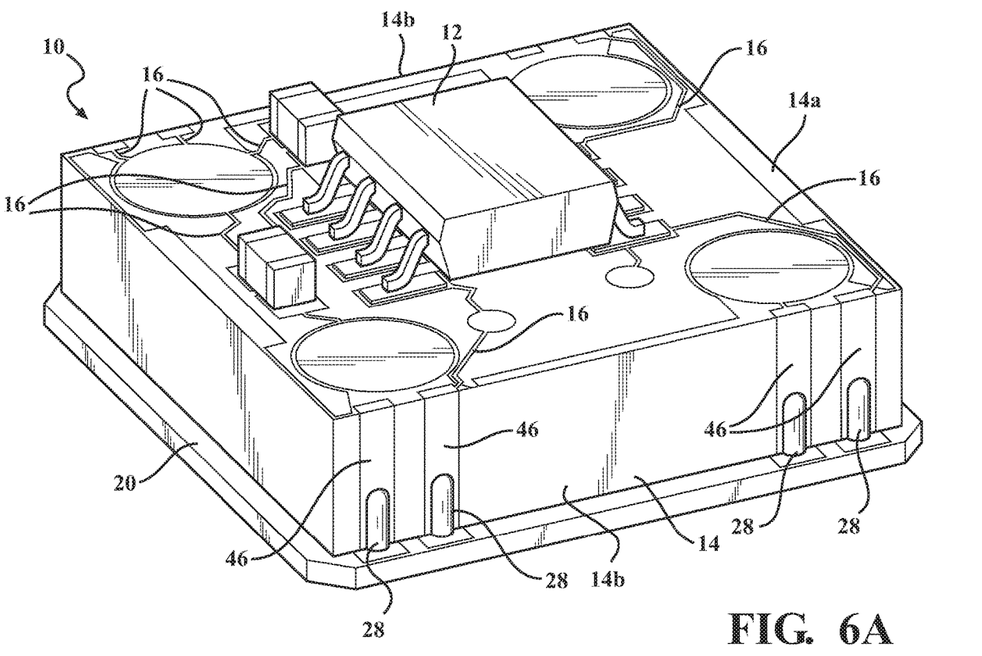
FIG. 6a is perspective view of a second embodiment of a pressure sensor assembly having at least one conductive joint, according to embodiments of the present invention.
Figure 6B:
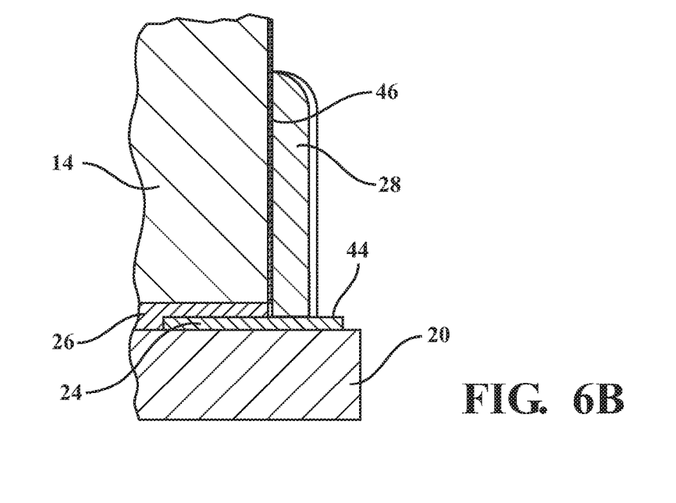
FIG. 6b is a partial sectional side view of a second embodiment of a pressure sensor assembly having at least one conductive joint, according to embodiments of the present invention.

An alternate embodiment of the pressure sensor assembly 10 is shown in FIGS. 6A-6B, with like numbers referring to like elements. In this embodiment, there are no side castellations 18 or sections of conductive material 40, and the side surfaces 14b of the support substrate 14 are flat. Additionally, in this embodiment, each of the plurality of vertical conductive paths has an extension portion 46, which is an extension of each of the electrical conductors 16. More specifically, in this embodiment, the extension portion 46 of each of the electrical conductors 16 extends along one of the side surfaces 14b of the support substrate 14, as shown in FIGS. 6A-6B. The electrical conductors 16 and the extension portions 46 may be connected to the support substrate 14 in a single manufacturing step, and in one embodiment, are made of the same material. Each of the electrical conductors 16 extends from the ASIC 12 on the top surface 14a of the support substrate 14 and connects to a corresponding extension portion 46. The conductive joints 28 are connected to a corresponding extension portion 46 of each electrical conductor 16 and a corresponding pad 44 of the lateral conductive feed-through 24, such that information regarding pressure readings from the sensing bridge 22 is able to be transferred to the ASIC 12.

Figure 7A:
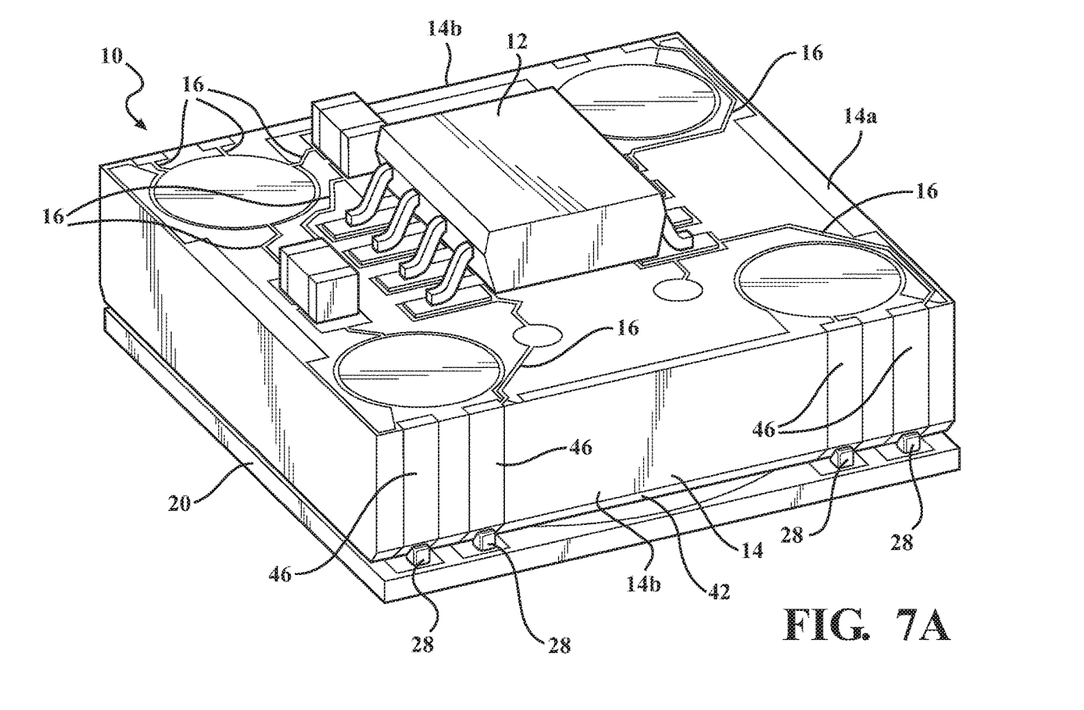
FIG. 7a is perspective view of a third embodiment of a pressure sensor assembly having at least one conductive joint, according to embodiments of the present invention.
Figure 7B:
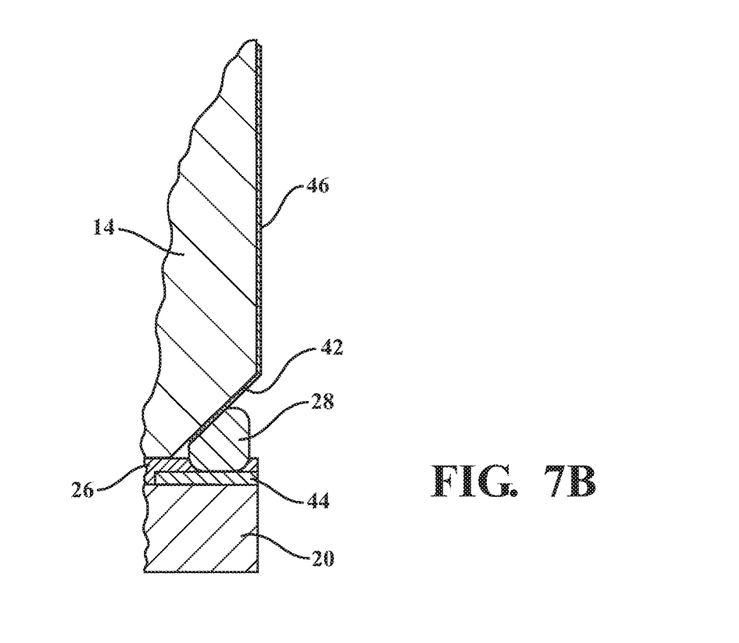
FIG. 7b is a partial sectional side view of a third embodiment of a pressure sensor assembly having at least one conductive joint, according to embodiments of the present invention.

Another embodiment of the invention is shown in FIGS. 7A-7B, with like numbers referring to like elements. In this embodiment, again there are no side castellations 18 or sections of conductive material 40, and again the plurality of vertical conductive paths are formed by the extension portions 46 of each of the electrical conductors 16. However, in this embodiment, there is a plurality of chamfers 42 formed as part of the support substrate 14. In this embodiment, each of the conductive joints 28 is connected to one of the extension portions 46 of each corresponding electrical conductor 16, and one of the lateral conductive feed-throughs 24 such that each of the conductive joints 28 is in contact with one of the chamfers 42. The use of the chamfers 42 allows for a reduction in width of the diaphragm 20, which allows for the overall size of the assembly 10 to be reduced, such that additional packaging requirements may be met. As shown in FIG. 7B, the width and depth of the diaphragm 20 is the same as the width and depth of the support substrate 14.

Figure 8:
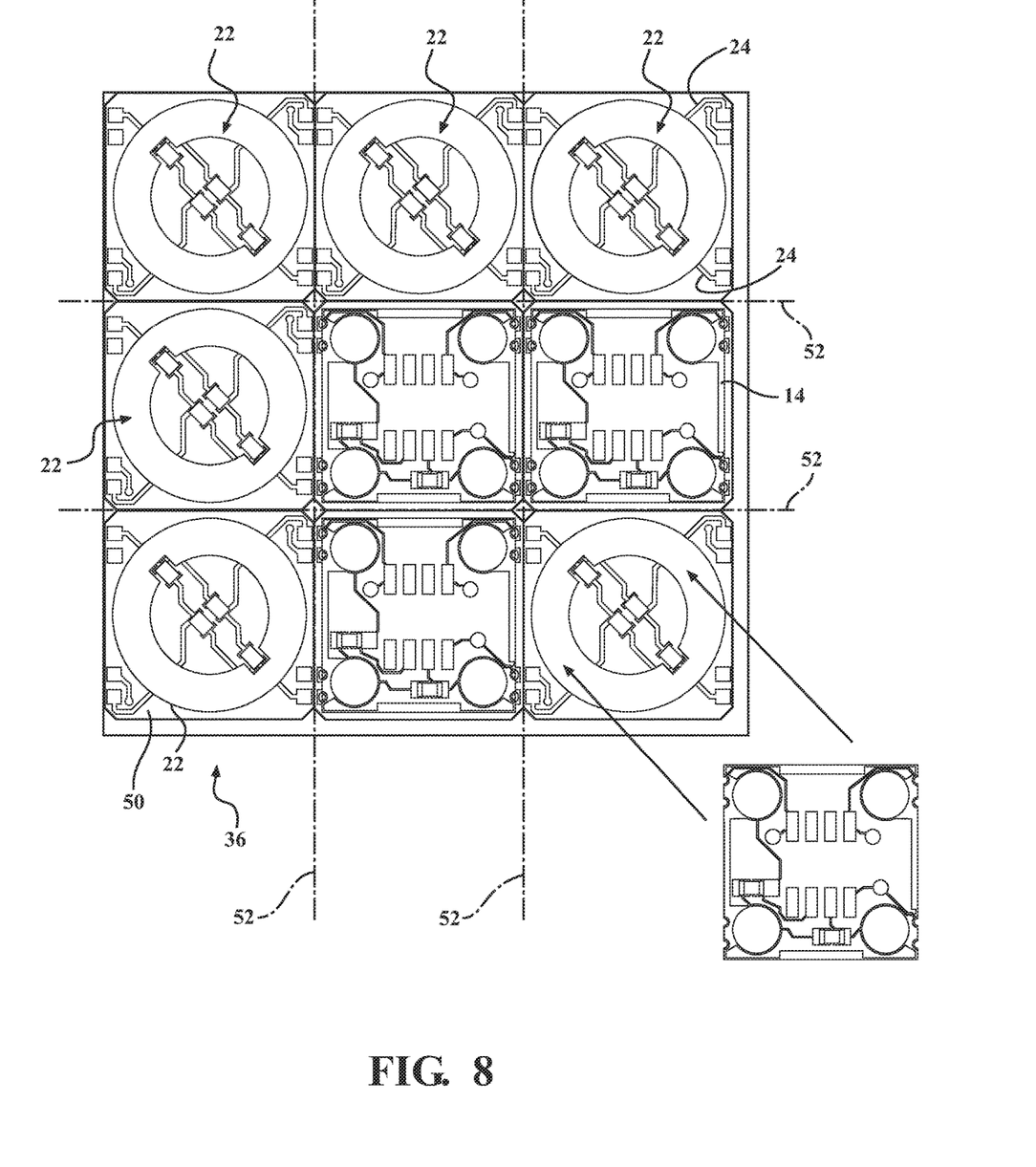
FIG. 8 is a top view of a sub-assembly used to make a first embodiment of a pressure sensor assembly, according to embodiments of the present invention.
Figure 9:
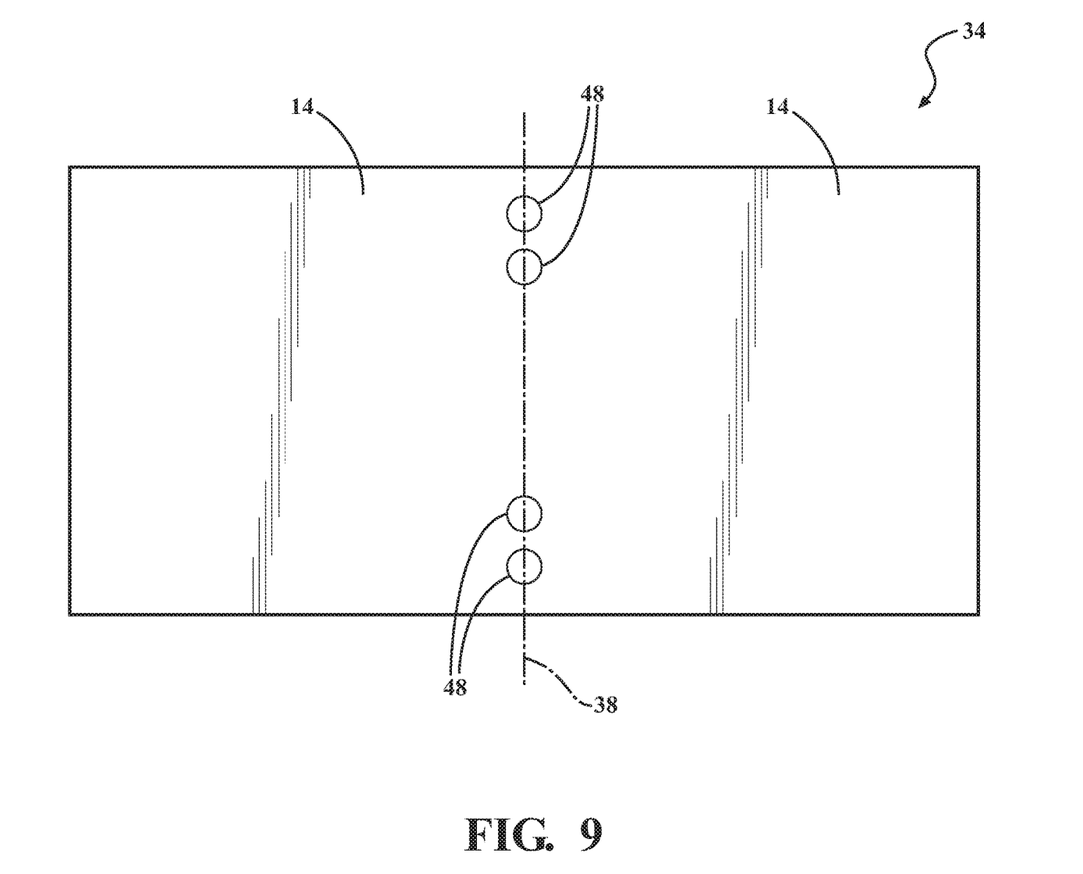
FIG. 9 is a top view of a sub-assembly used to make multiple support substrates used as part of a first embodiment of a pressure sensor assembly, according to embodiments of the present invention

Referring now to FIGS. 8-9, an example of fabrication of the first embodiment of the pressure sensor assembly 10, and more specifically, a plurality of pressure sensors assemblies 10 is shown. Typically, the fabrication process generates hundreds of the same devices from large substrates used to make each support substrate 14 and each diaphragm 20. For simplicity, FIGS. 8-9 only shows a portion of two large substrates used to make several sensor assemblies 10. A first large substrate is used to create each support substrate 14, and a second large substrate is used to create each diaphragm substrate 20.

During assembly, several support substrates 14 are made from a large first substrate, shown generally at 34, shown in FIG. 9. A machining operation is then performed to remove material, shown at material removal areas 48, resulting in the formation of the side castellations 18 once the fabrication of each support substrate 14 is completed. The machining operation may be drilling, milling, or any other suitable operation to eliminate the material in the material removal areas 48. After the machining operation is complete, the conductors 16 are then assembled to the first substrate 34 and the conductive material 40 is attached to the inner sidewalls of the material removal areas 48, forming a sub-assembly. After the steps of the attachment of the conductors 16 to the first substrate 34 and the conductive material 40 is attached to the side walls of the material removal areas 48, are both completed, the sub-assembly undergoes a singulation process. During the singulation process, the sub-assembly is cut along a scribe line 38, shown in FIG. 9. The large substrate 34 may be as long as needed such that as many support substrates 14 may be made as desired. Fabricating the support substrates 14 in this manner does not use any internal area of any of the support substrates 14, which reduces the amount of drilling, and the number of cuts made during the singulation process.

The process also includes a second substrate 50, which is another large substrate 50, used to create each diaphragm substrate 20. During the manufacturing process, the lateral conductive feed-throughs 24 and corresponding pads 44 are deposited on the second substrate 50. As many lateral conductive feed-throughs 24 and pads 44 may be used as necessary depending upon the length of the second substrate 50. After the lateral conductive feed-throughs 24 and corresponding pads 44 are attached to the second substrate 50, each of the support substrates 14 are attached to the large substrate 50 using as many of the sealing glass sections 26 as needed which corresponds to the number of support substrates 14 being used. As many sealing glass sections as needed may be used (depending upon the length of the first substrate 34 and the second substrate) to connect the substrates 14 to the second substrate 50.

Once the support substrates 14 are attached to the second substrate 50, another singulation process is used to cut the second substrate 50 along the scribe lines 52, shown in FIG. 8.

Figure 1:
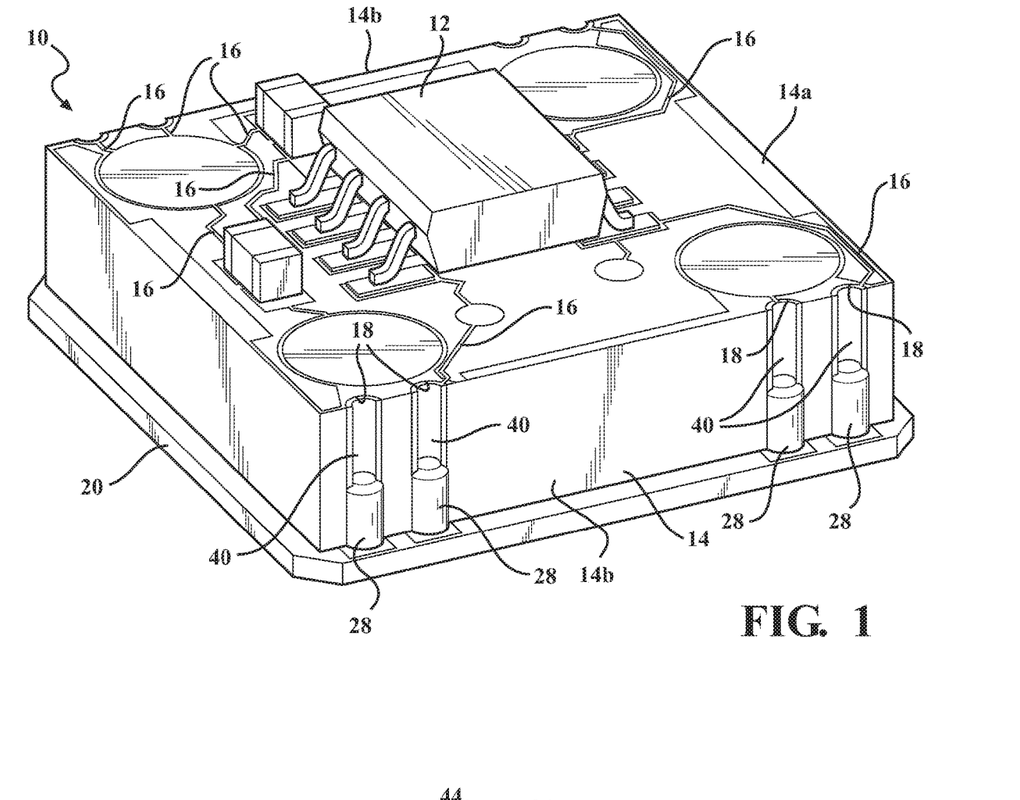
FIG. 1 is perspective view of a first embodiment of a pressure sensor assembly having at least one conductive joint, according to embodiments of the present invention.
Figure 2:
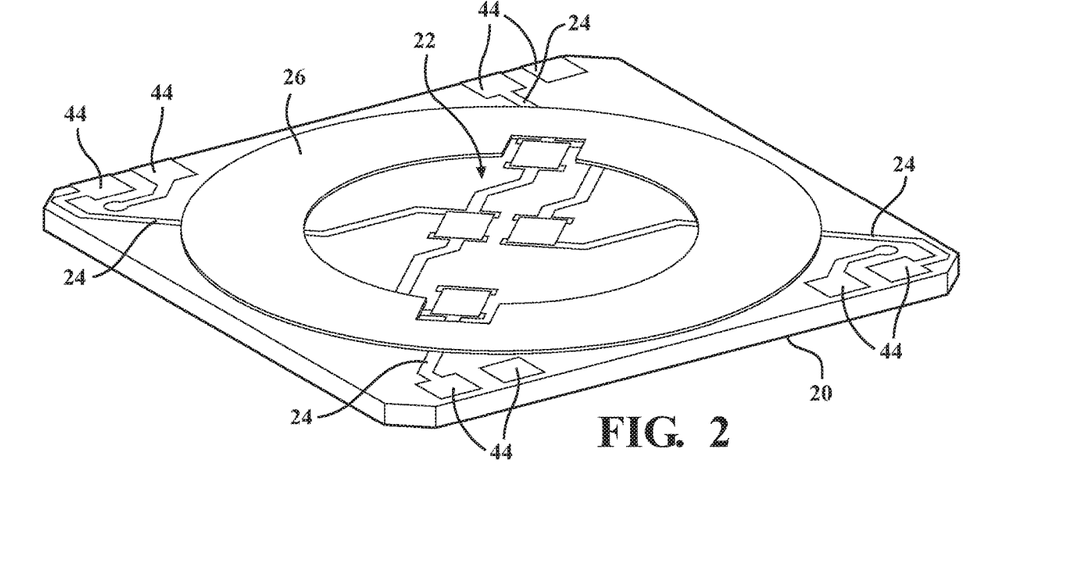
FIG. 2 is a perspective view of a diaphragm which is part of a first embodiment of a pressure sensor assembly having at least one conductive joint, according to embodiments of the present invention.
Figure 3:
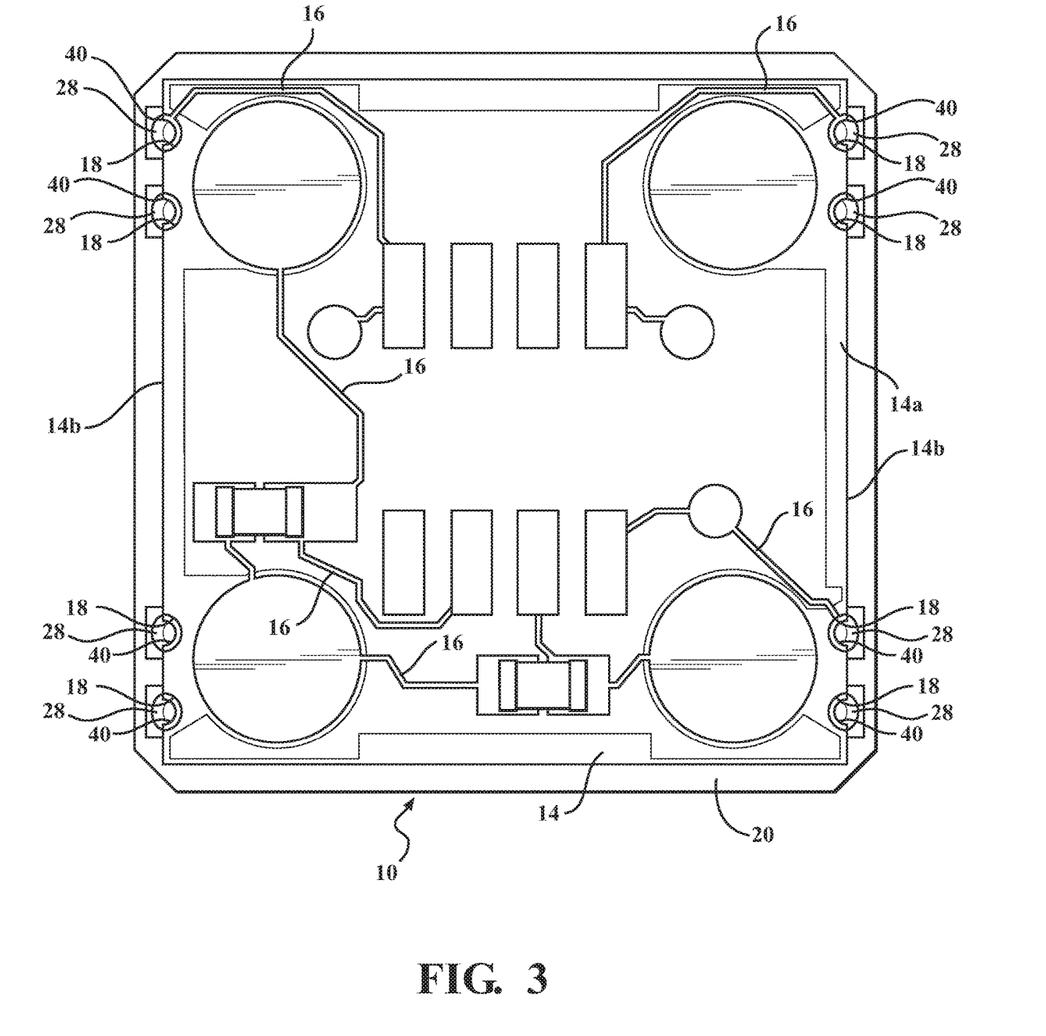
FIG. 3 is top view of a first embodiment of a pressure sensor assembly having at least one conductive joint, according to embodiments of the present invention.
Figure 4:
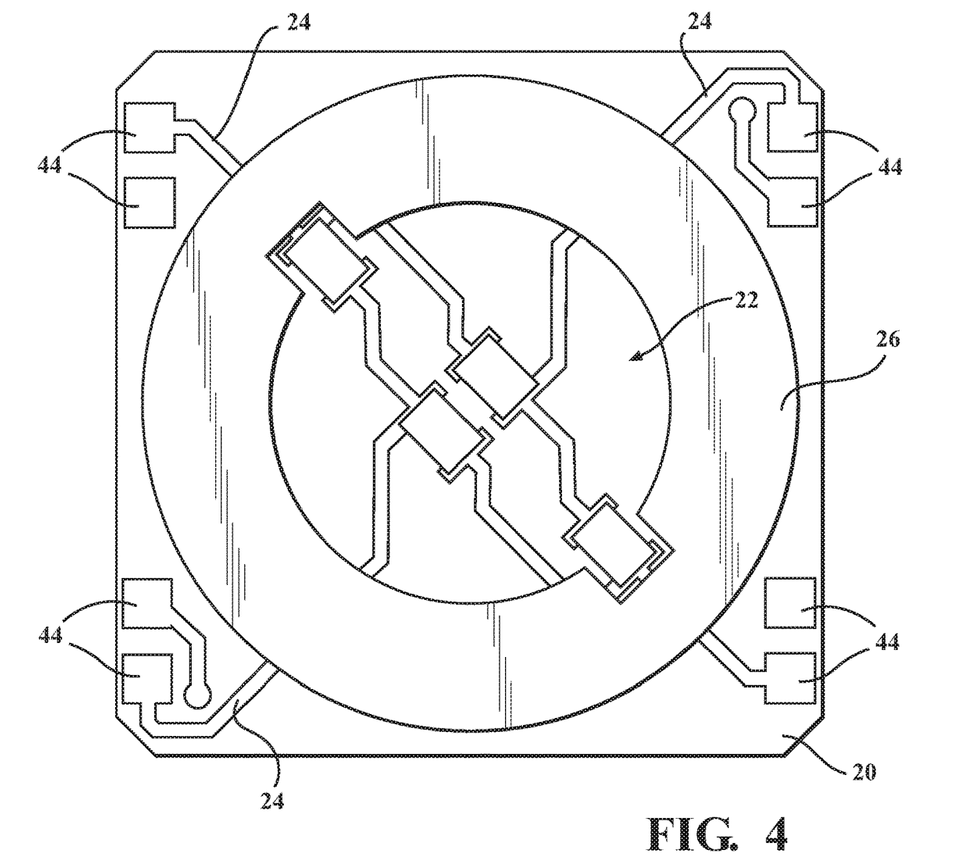
FIG. 4 is top view of a first embodiment of a pressure sensor assembly having at least one conductive joint, according to embodiments of the present invention.
Figure 5:
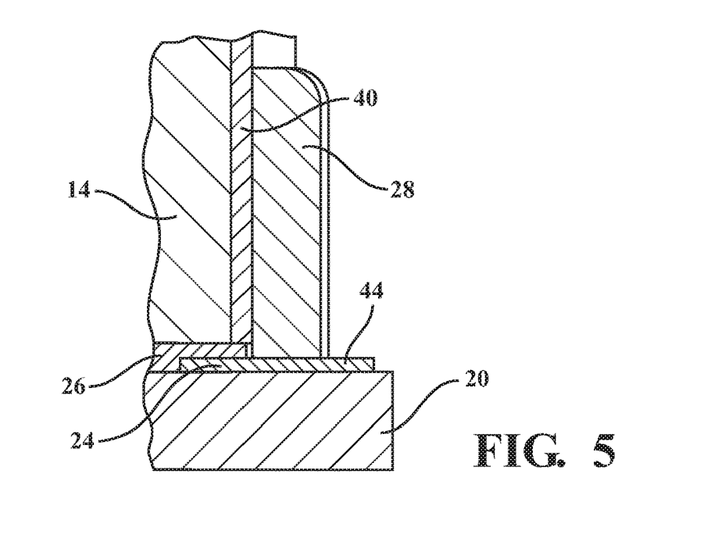
FIG. 5 is a partial sectional side view of a first embodiment of a pressure sensor assembly having at least one conductive joint, according to embodiments of the present invention.

Once the singulation process is complete, the conductive joints 28 are then attached to the corresponding sections of conductive material 40 and the pads 44 of the corresponding lateral conductive feed-throughs 24, completing the assembly of each pressure sensor assembly 10. Lastly, each ASIC 12 is assembled to a corresponding support substrate 14 as shown in FIGS. 1, 6A, and 7A.

The description of the invention is merely exemplary in nature and, thus, variations that do not depart from the gist of the invention are intended to be within the scope of the invention. Such variations are not to be regarded as a departure from the spirit and scope of the invention.

What is claimed is:
1. A pressure sensor assembly, comprising:
a support substrate;
at least one conductor mounted to the support substrate;
at least one vertically conductive path connected to and in electrical communication with the at least one conductor, the at least one vertically conductive path further comprising:
at least one side castellation integrally formed as part of the support substrate; and
at least one section of conductive material deposited on the at least one side castellation, such that the at least one section of conductive material is in electrical communication with the at least one conductor;
a sensing bridge; and
at least one conductive joint in electrical communication with the at least one vertically conductive path and the sensing bridge, and the at least one section of conductive material is connected to and in electrical communication with the at least one conductive joint;
wherein the sensing bridge sends a signal through the at least one vertically conductive path to the at least one conductor indicating the amount of pressure applied to the sensing bridge.

2. The pressure sensor assembly of claim 1, further comprising a diaphragm substrate, wherein the sensing bridge is mounted to the diaphragm substrate.

3. The pressure sensor assembly of claim 2, further comprising at least one sealing glass section connected to the diaphragm substrate and the support substrate.

4. The pressure sensor assembly of claim 2, further comprising:
at least one lateral conductive feed-through mounted to the diaphragm substrate;
wherein the at least one lateral conductive feed-through is connected to and in electrical communication with the sensing bridge and the at least one conductive joint.

5. The pressure sensor assembly of claim 1, the at least one side castellation integrally formed as part of a side surface of the support substrate.

6. The pressure sensor assembly of claim 1, the at least one conductive joint further comprising at least one of a solder material or an ECA material.

7. The pressure sensor assembly of claim 1, further comprising:
circuitry mounted to the support substrate;
wherein the circuitry is connected to an in electrical communication with the at least one conductor, such that the signal indicating the amount of pressure applied to the sending bridge is sent to the circuitry.

8. A pressure sensor assembly, comprising:
a support substrate;
at least one conductor mounted to the support substrate;
at least one vertically conductive path connected to and in electrical communication with the at least one conductor, the at least one vertically conductive path further comprising an extension portion of the at least one conductor extending along at least one side of the support substrate;
a sensing bridge; and
at least one conductive joint in electrical communication with the at least one vertically conductive path and the sensing bridge, and the extension portion of the at least one conductor is connected to and in electrical communication with the at least one conductive joint;
wherein the sensing bridge sends a signal through the at least one vertically conductive path to the at least one conductor indicating the amount of pressure applied to the sensing bridge.

9. The pressure sensor assembly of claim 8, the extension portion located on a side surface of the support substrate.

10. The pressure sensor assembly of claim 8, further comprising:
at least one chamfer integrally formed as part of the substrate;
wherein the at least one conductive joint is located such that the at least one conductive joint is in contact with the at least one chamfer, and the at least one conductive joint provides electrical communication between the extension portion and the sensing bridge.

11. A pressure sensor assembly, comprising:
a support substrate;
circuitry mounted to the support substrate;
at least one conductor mounted to the support substrate and in electrical communication with the circuitry;
at least one vertically conductive path connected to and in electrical communication with the at least one conductor;
a diaphragm substrate;
a sensing bridge mounted to the diaphragm substrate;
at least one sealing glass section connected to the diaphragm and the support substrate;
at least one lateral conductive feed-through mounted to the diaphragm; and
at least one conductive joint connected to the at least one vertically conductive path and the at least one lateral conductive feed-through;
wherein the at least one conductive joint provides electrical communication between the at least one vertically conductive path and the at least one lateral conductive feed-through.

12. The pressure sensor assembly of claim 11, the at least one vertically conductive path further comprising:
at least one side castellation integrally formed as part of the support substrate; and
at least one section of conductive material deposited on the at least one side castellation, such that the at least one section of conductive material is in electrical communication with the at least one conductor;
wherein the at least one section of conductive material is connected to and in electrical communication with the at least one conductive joint.

13. The pressure sensor assembly of claim 12, the at least one side castellation integrally formed as part of a side surface of the support substrate.

14. The pressure sensor assembly of claim 11, the at least one vertically conductive path further comprising an extension portion of the at least one conductor.

15. The pressure sensor assembly of claim 14, the extension portion located on a side surface of the support substrate.

16. The pressure sensor assembly of claim 11, the at least one vertically conductive path further comprising:
at least one chamfer integrally formed as part of the substrate;
an extension portion of the at least one conductor;
wherein the at least one conductive joint is located such that the at least one conductive joint is in contact with the at least one chamfer, and the at least one conductive joint provides electrical communication between the extension portion and the at least one lateral conductive feed-through.

17. The pressure sensor assembly of claim 16, wherein the width and depth of the support substrate is equal to the width and depth of the diaphragm substrate.

18. The pressure assembly of claim 11, the at least one conductive joint further comprising at least one of a solder material or an ECA material.

* * * * *